United States Patent [19]

Fraley et al.

[11] 4,251,621
[45] Feb. 17, 1981

[54] SELECTIVE METAL ETCHING OF TWO GOLD ALLOYS ON COMMON SURFACE FOR SEMICONDUCTOR CONTACTS

[75] Inventors: Phillip E. Fraley, Reading; Ronald L. Lapinsky, Laureldale, both of Pa.

[73] Assignee: Bell Telephone Laboratories, Incorporated, Murray Hill, N.J.

[21] Appl. No.: 93,939

[22] Filed: Nov. 13, 1979

[51] Int. Cl.³ .............................................. G03C 5/00
[52] U.S. Cl. .................... 430/312; 156/656; 156/659.1; 156/661.1; 430/316; 430/319; 430/330; 430/394
[58] Field of Search ............... 430/312, 316, 319, 330, 430/394; 156/656, 659, 661

[56] References Cited

U.S. PATENT DOCUMENTS

| | | | |
|---|---|---|---|
| 3,563,999 | 4/1972 | Fuller | 430/316 X |
| 3,709,695 | 1/1973 | Bowman | 430/312 |
| 3,767,397 | 10/1973 | Akiyama | 430/312 |
| 3,817,750 | 6/1974 | Kaiser | 430/312 |
| 3,957,552 | 5/1976 | Ahn et al. | 430/312 X |
| 4,040,891 | 8/1977 | Chang et al. | 156/661.1 X |
| 4,063,992 | 12/1977 | Hosack | 156/661.1 X |

Primary Examiner—Edward C. Kimlin
Attorney, Agent, or Firm—H. W. Lockhart

[57] ABSTRACT

Low resistance or ohmic contacts to p and n-type conductivity semiconductor material sometimes requires a different metal for each contact. Intermixing of these metals is undesirable so that special measures are necessary to form such contacts in close proximity on a common semiconductor surface.

Using gold alloy contact materials, a first gold alloy is deposited on the common surface and defined by photolithography to make the contact to material of one conductivity type. The common surface and first contact then are covered by successive layers of titanium and gold. The titanium-gold layer is selectively etched by photolithographic means to expose the material of opposite conductivity type. A second gold alloy layer then is deposited on the exposed surface, and patterned photolithographically using an etchant which removes the gold and gold alloys but does not attack titanium. Finally, the titanium protective layer is removed using a selective etchant which does not attack gold or gold alloys. The contacts are alloyed by heating.

6 Claims, 6 Drawing Figures

SELECTIVE METAL ETCHING OF TWO GOLD ALLOYS ON COMMON SURFACE FOR SEMICONDUCTOR CONTACTS

BACKGROUND OF THE INVENTION

This invention relates to substantially ohmic, that is, low resistance contacts to semiconductor materials. More particularly, it relates to such contacts on compound semiconductor materials where good ohmic contact to p and n-type conductivity material requires different metals for each type. This occurs particularly where contact is to be made to a relatively lightly doped material.

A problem arises when it is desired to form two ohmic contacts each containing a different metal on a common surface of a semiconductor, one to p-type conductivity material and the other to n-type conductivity material. It has been found that any intermixing of the two contacting metals tends to degrade the ohmic character of one or both of the contacts.

The problem of intermixing can be solved by using metal masks to control the evaporation deposition of the metals, but this procedure has distinct limitations from the standpoint of achieving the cross-spacing and area definition now required in semiconductor device fabrication. Ordinarily, such definition is achieved using photolithography which, however, if used in the straightforward fashion, is susceptible to the intermixing of the two contact metals.

Accordingly, an object of this invention is a method of making a pair of ohmic contacts to both p and n-type conductivity material on a common surface of a semiconductor body with the close-spaced definition required by current technology.

SUMMARY OF THE INVENTION

In accordance with a specific embodiment of the invention, a pair of ohmic contacts are formed on a common surface of a semiconductor body of gallium phosphide or gallium arsenide phosphide by utilizing the differential etching response of gold and gold alloys, and titanium.

In a specific embodiment a layer of silicon-gold alloy is deposited on a surface of an n-type conductivity body of gallium phosphide having a p-type conductivity zone adjacent the surface. This first gold alloy layer is defined photolithographically using typically a gold etchant composed of potassium iodide, iodine, and water to form a first contact to the n-type portion of the semiconductor body. This first contact may be alloyed lightly into the semiconductor body by heating at this time, or alloying may be deferred until both contacts have been formed.

The common surface and the first contact then are covered with a thin layer of titanium which in turn is covered with a thin layer of gold. A photoresist mask then is formed to define the p-type surface of the body while leaving the first contact covered by the gold-titanium layers.

After removal of the gold-titanium layers over the p-type portion, successive layers of beryllium-gold and gold then are deposited on the exposed surface and over the previously formed metal layers. A photoresist mask then is formed defining the second contact which is to the p-type portion and is composed of the beryllium-gold and gold layer. The gold etchant then is applied which removes all of the gold and gold alloy layers except for the second contact covered by the photoresist mask and exposes the titanium layer overlying and protecting the first contact. The titanium is not attacked by the gold etchant described hereinbefore. Next, the titanium layer is removed using an etchant which is selective to titanium but does not etch gold or gold alloys. Such an etchant is a mixture of ethylenediaminetetraacetic acid-ammonium hydroxide-water. Finally, the body is heated in the range of 500 to 600 degrees C. to alloy one or both of the contacts depending upon whether the first contact was alloyed as soon as it was formed or deferred.

Thus, in accordance with the method of the invention, a separate contact to semiconductor material of opposite conductivity type is formed in close proximity on a common surface of a semiconductor body without the intermixing of the two different metal alloys which would render one or both of the contacts non-ohmic or, at least, of a resistance level unsuitable for connection purposes.

One feature of the invention is the use of photolithography for forming the contacts to both p and n-type material on a common surface of a semiconductor body, thus enabling the realization of the definition achieved by current technology. A further feature of the invention is the use of titanium which can be etched without any consequent attack on the associated contacting metals, the titanium thus providing a suitable protective barrier against intermixing during fabrication.

Moreover, the use of photoresist technology enables a batch processing and thus mass production of semiconductor devices. Also, it enables a broad range in the size, geometry, and pattern arrangement of the ohmic contacts.

BRIEF DESCRIPTION OF THE DRAWING

The invention and its objects and further features will be better understood from the following detailed description taken in conjunction with the drawing in which.

DETAILED DESCRIPTION

Figure 1:
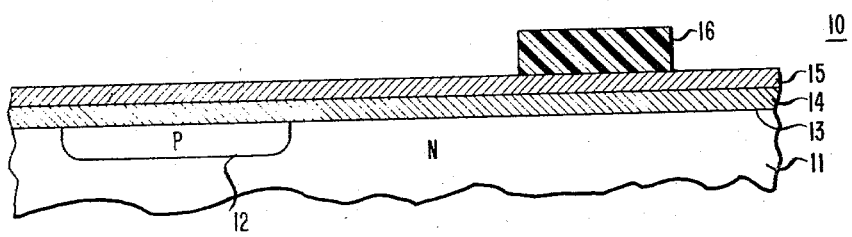
FIGS. 1 through 6 are a series of cross-sectional views taken through a portion of a semiconductor body, depicting the successive processing steps in accordance with a specific embodiment of this invention.

Referring to FIG. 1, element 10 comprises a portion of a semiconductor chip 11 of single crystal gallium phosphide of n-type conductivity. Typically, the n-type chip portion 11 is formed by liquid-phase epitaxy on a beginning single crystal portion of a more heavily doped n-type conductivity material. In one portion of the n-type chip 11 adjoining the surface 13, there is a p-type conductivity portion 12 formed typically by selective diffusion of a suitable impurity, for example, zinc, to convert the n-type material to p-type conductivity.

The purpose of the fabrication method described herein is to form ohmic contacts on the common surface 13 to both the p-type portion 12 and the n-type portion 11. For semiconductor material such as gallium phosphide, particularly where the impurity doping is comparatively low, as is true typically in light-emitting devices, a different metal is required for contacting the n-type material from that used to contact the p-type material.

Specifically, in the embodiment described herein where the n-type conductivity material has a doping level in the range of from 1.5 to $4\times10^{17}/cm^3$, a silicon gold alloy provides a satisfactory ohmic contact. To the p-type conductivity portion where the doping level is 2 to $3\times10^{18}/cm^3$, a beryllium-gold alloy is most suitable for forming a low resistance connection.

Thus, in FIG. 1, a first contact layer 14 comprising a silicon-gold alloy is deposited typically by evaporation. In accordance with one procedure, the charge in an evaporating crucible consists of a silicon-gold alloy which is vaporized and deposited to form a relatively homogeneous layer 14. Alternatively, it is possible to deposit a first thin polysilicon layer followed by a heavier layer of gold. Subsequent heating serves to mix the two layers to produce the required alloy for making the ohmic contact. In a particular embodiment, the first contact layer 14 comprising a silicon-gold alloy may have a thickness of 5,000 Angstroms. Advantageously, this layer is covered by a protective gold layer 15, also 5,000 Angstroms thick, which is applied to prevent corrosion or tarnishing of the underlying contact layer and to provide the final specified alloy ratio.

This silicon-gold alloy layer 14–15 advantageously has a silicon content ranging from about 0.24 to about 5.7 percent by weight. The percentage of silicon needed is, to a considerable extent, determined by the doping level of the n-type material. In a specific embodiment, where the n-type doping level is about $2\times10^{17}/cm^3$ the silicon percentage range is about 0.24 to about 1.0. Also, for light-emitting devices, the amount of silicon present affects the light absorption characteristics of the contact; the more silicon present, the more absorptive and less reflective is the contact. In one particular embodiment, a first film of about 250 Angstroms of silicon was deposited on the surface 13 followed by about 10,000 Angstroms of gold.

Next, by photolithographic techniques, a photoresist mask 16 is formed on top of the layers 14 and 15, and a gold etchant is applied to remove all of the layers except for that part covered by the mask 16. A suitable etchant is a mixture of potassium iodide, iodine, and water. In a specific embodiment, this etchant comprises a mixture of 678 grams of potassium iodide, 390 grams of iodine, and 600 milliliters of water. This mixture then is diluted in water in the ratio of one part to twenty parts of water.

Figure 2:
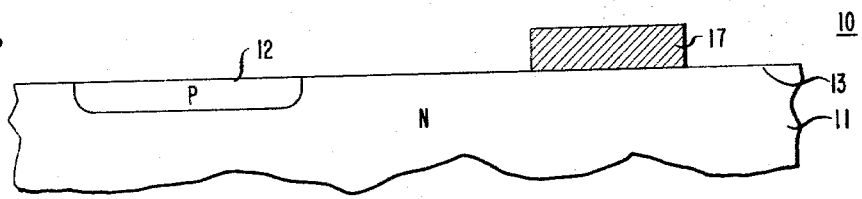

Following this treatment, the element 10 appears as shown in FIG. 2, with the first gold alloy contact 17 defined on the n-type conductivity portion 11. At this juncture, the first contact may be alloyed by heating it at about 600 degrees C. to produce the desired low resistance connection. Alloying at this time is advantageous if testing of the connection is required before continuing with the fabrication process. Whether the contact has been alloyed or not, the multiple layers of the first contact will be treated hereafter as a single contact element 17.

Figure 3:
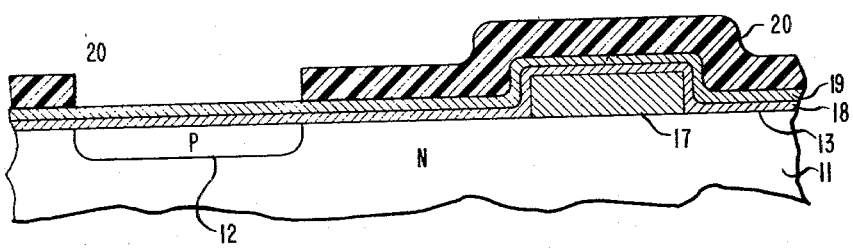

Next, as shown in FIG. 3 the surface 13, and contact 17, and particularly the portion of the surface 13 peripheral to the contact 17, is covered by a layer 18 of titanium, which, in turn, is covered by a layer of gold 19. Typically, these two layers have a thickness of about 1,000 Angstroms each in order to provide their protective function. In particular, the titanium is not attacked by the gold etchant described above so that it will remain in place during subsequent steps for patterning the gold. The thin gold layer 19 is applied to prevent the formation of an oxide film on the titanium which would inhibit its response to the titanium etch which is used.

Also, as shown in FIG. 3, a photoresist mask 20 is formed which is coextensive with the surface of the p-type portion 12. Then the surface of the p-type portion 12 is exposed by treating the element 10 with first, the gold etch to remove the exposed portion of the gold layer 19, followed by the application of a titanium etchant to expose the surface of the p-type portion 12. A suitable titanium etch comprises a mixture of ethylenediaminetetraacetic acid-ammonium hydroxide-water (EDTA) in the proportions of 23.3 grams ethylenediaminetetraacetic, 50 milliliters ammonium hydroxide, and 1000 milliliters water. The solution typically is used at a temperature of 60 degrees C. ±2 degrees.

Figure 4:
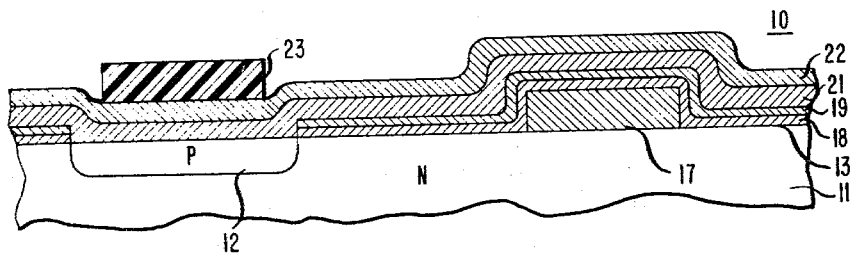

Next, as shown in FIG. 4, second gold alloy contact layers 21 and 22 are deposited over the exposed p-type portion and the other metal layers on the surface 13. Although shown as separate layers 21 and 22, this contact deposition is analogous to the first gold alloy contact except that the alloy is a beryllium-gold alloy. It may be formed by the deposition of a first layer 21 by evaporating beryllium-gold alloy followed by deposition of a gold layer 22, both of which later are intermixed to produce a contact element having the required content of beryllium. Typically, the final contact element has a beryllium content of from about 0.75 to 1.15 percent by weight.

Figure 5:
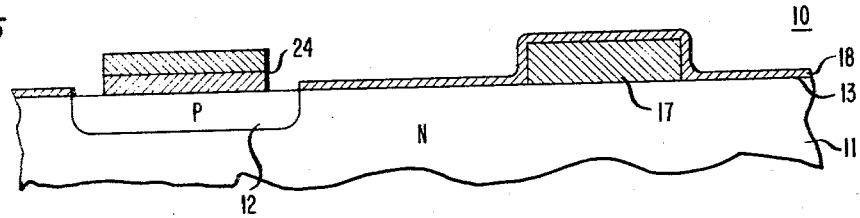

Next, as shown in FIG. 4, a photoresist mask 23 is formed to define the extent of the second gold alloy contact on the p-type conductivity portion 12. The gold etchant previously described is applied to the structure shown in FIG. 4 which removes the exposed portions of layers 22, 21, and 19, leaving the titanium layer 18 in place, particularly over the first gold alloy contact 17 and surrounding parts of surface 13. The result of this treatment is the arrangement shown in FIG. 5 in which the second gold alloy contact 24 is defined over the p-type portion 12. Next, the EDTA etchant is applied to the surface of the element 10 which removes the titanium protective layer 18 which has prevented intermixture of the beryllium-gold second alloy contact with the silicon-gold first contact alloy during contact fabrication.

Figure 6:
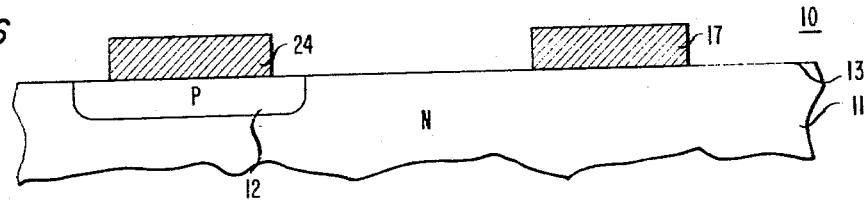

Finally, referring to FIG. 6, the body is heated typically at 500 degrees C. if the first alloy contact 17 has already been alloyed or at about 600 degrees C. if it has not, in order to complete alloying of both contacts.

Although the invention has been described in terms of its use with gallium phosphide and with particular gold alloy contact materials, the invention may also be used with other semiconductors which use gold alloys to make contact to opposite conductivity-type material and where the contacts are in close proximity in a common surface. Among such compound semiconductors, in addition to gallium phosphide and gallium arsenide phosphide, are indium phosphide and gallium arsenide and the combination thereof indium gallium arsenide phosphide, and the ternary compound, useful for lasers, gallium aluminum arsenide. Basically, the invention rests upon the selective response to particular etchants of gold and gold alloys and titanium.

What is claimed is:

1. A method of fabricating low resistance contacts to a semiconductor device comprising a body of semiconductor material, the body having a major surface and first and second portions of opposite conductivity type adjoining the major surface, the contact to the first portion comprising a first gold alloy and the contact to the second portion comprising a second gold alloy different from the first gold alloy, the method comprising, (1) forming by deposition, photolithography, and chemical etching a first gold alloy contact on a limited area of the surface of the first portion, (2) depositing a layer of titanium completely over the first gold alloy contact and the portion of the surface peripheral to the contact, (3) coating the entire surface of the titanium layer with a gold layer, (4) photolithographically forming a photoresist mask that is coextensive with the surface at the said second portion of the surface, (5) etching away the gold and titanium layers not protected by said photoresist mask to bare the said second portion of the surface, (6) coating the said second gold alloy over the said bared second portion of the surface and on the remaining gold layer from step (3) above, (7) photolithographically forming another photoresist mask which protects the second gold alloy only at the said second portion of the surface, (8) etching away the non-protected layers of the second gold alloy and the gold layer of step (3) above, leaving the titanium layer, (9) removing the titanium layer by treating the body with an etchant which attacks titanium but does not attack gold or gold alloys,

(10) heating the body to alloy the contacts.

2. The method in accordance with claim 1 in which the semiconductor material is a compound semiconductor material.

3. A method in accordance with claim 2 in which the semiconductor material is one selected from the group consisting of gallium phosphide and gallium arsenide phosphide.

4. The method in accordance with claim 3 in which the first gold alloy includes silicon and the second gold alloy includes beryllium.

5. The method in accordance with claim 4 in which the etchant for gold and gold alloys comprises a mixture of potassium iodide, iodine, and water, and the etchant for titanium comprises a mixture of ethylenediaminetetraacetic acid, ammonium hydroxide and water.

6. the method in accordance with claim 4 in which the first gold alloy includes silicon in the range of from about 0.24 to about 5.7 percent by weight, and the second gold alloy includes beryllium in the range of from about 0.75 to 1.15 percent by weight.

* * * * *